United States Patent
Ngo et al.

(10) Patent No.: US 7,534,732 B1
(45) Date of Patent: May 19, 2009

(54) SEMICONDUCTOR DEVICES WITH COPPER INTERCONNECTS AND COMPOSITE SILICON NITRIDE CAPPING LAYERS

(75) Inventors: Minh Van Ngo, Fremont, CA (US); Erik Wilson, Santa Clara, CA (US); Hieu Pham, Milpitas, CA (US); Robert Huertas, Hollister, CA (US); Lu You, San Jose, CA (US); Hirokazu Tokuno, Cupertino, CA (US); Alexander Nickel, Santa Clara, CA (US); Minh Tran, Milpitas, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 287 days.

(21) Appl. No.: 11/356,311

(22) Filed: Feb. 17, 2006

(51) Int. Cl.
*H01L 21/4763* (2006.01)
*H01L 21/44* (2006.01)
*H01L 21/31* (2006.01)

(52) U.S. Cl. .................. 438/792; 438/630; 438/655; 438/682; 257/E21.293; 257/E21.302

(58) Field of Classification Search .............. 438/655, 438/630, 682, 791, 792, 793, 794; 257/E21.293, 257/E21.302
See application file for complete search history.

(56) References Cited

U.S. PATENT DOCUMENTS

| 6,165,894 | A | 12/2000 | Pramanick et al. |
| 6,506,677 | B1 * | 1/2003 | Avanzino et al. ............ 438/687 |
| 6,596,631 | B1 | 7/2003 | Ngo et al. |
| 6,599,827 | B1 | 7/2003 | Ngo et al. |
| 6,656,840 | B2 * | 12/2003 | Rajagopalan et al. ....... 438/687 |
| 6,660,634 | B1 | 12/2003 | Ngo et al. |
| 6,680,249 | B2 | 1/2004 | Lu et al. |
| 6,737,747 | B2 * | 5/2004 | Barth et al. ................. 257/760 |
| 6,790,778 | B1 | 9/2004 | Cheng et al. |

* cited by examiner

*Primary Examiner*—Alexander G Ghyka
*Assistant Examiner*—Seahvosh J Nikmanesh
(74) *Attorney, Agent, or Firm*—McDermott Will & Emery LLP

(57) ABSTRACT

Cu interconnects are formed with composite capping layers for reduced electromigration, improved adhesion between Cu and the capping layer, and reduced charge loss in associated non-volatile transistors. Embodiments include depositing a first relatively thin silicon nitride layer having a relatively high concentration of Si—H bonds on the upper surface of a layer of Cu for improved adhesion and reduced electromigration, and depositing a second relatively thick silicon nitride layer having a relatively low concentration of Si—H bonds on the first silicon nitride layer for reduced charge loss.

7 Claims, 2 Drawing Sheets

SEMICONDUCTOR DEVICES WITH COPPER INTERCONNECTS AND COMPOSITE SILICON NITRIDE CAPPING LAYERS

FIELD OF THE INVENTION

The present invention relates to copper (Cu) and/or Cu alloy metallization in semiconductor devices, and to a method for forming reliably capped Cu or Cu alloy interconnects. The present invention is particularly applicable to manufacturing high-speed integrated circuits in semiconductor memory devices, particularly flash memory devices, with reduced charge loss, reduced electromigration and improved capping layer adhesion.

BACKGROUND OF THE INVENTION

Semiconductor memory devices, such as erasable, programmable, read-only memories (EPROMs), electrically erasable programmable read-only memories (EEPROMs), and flash erasable programmable read-only memories (FEPROMs) are erasable and reusable, and are employed in various commercial electronic devices, such as computers, cellular telephones and digital cameras. There has recently evolved devices termed mirrorbit devices which do not contain a floating gate electrode. In mirrorbit devices, the gate electrode is spaced apart from the substrate by an oxide/nitride/oxide (ONO) stack, such as a silicon oxide/silicon nitride/silicon oxide stack. In such devices the charge is contained within the nitride layer of the ONO stack. The relentless drive for miniaturization has led to the fabrication of flash memory devices comprising transistors having a gate width of about 150 nm and under, and gate structures spaced apart by a gap of 225 nm or less. Conventional practices comprise forming a sidewall spacer on side surfaces of the gate stack, thereby reducing the gate gap to about 25 nm.

As device dimensions shrink into the deep sub-micron regime, vulnerability to mobile ion contamination, such as hydrogen degradation, increases. The inability to adequately getter mobile ion contaminants, such as hydrogen ions, results in a neutralization of electrons and, hence, leakage causing programming loss as well as a charge gain causing reappearance of erased information.

As device features plunge into the deep submicron regime, interconnect technology is transitioning from aluminum-based to copper-based metallurgy. This technological evolution has come about through the adoption of damascene and dual-damascene process flows involving electrolytic copper plating and chemical mechanical polishing (CMP) techniques. The technological benefits of Cu, such as reduced R×C delay are clear; however, various reliability issues have evolved. For example, due to Cu diffusion through interlayer dielectric materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WsiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer, such as TaN, lining the opening and on the surface of the interlayer dielectric, filling the opening with Cu or a Cu alloy layer, implementing CMP, and forming a silicon nitride capping (diffusion barrier) layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to removal, as by peeling due to scratching or stresses resulting from subsequent deposition of layers. As a result, the Cu or Cu alloy is not entirely encapsulated and Cu diffusion occurs, thereby adversely affecting device performance and decreasing electromigration and stress migration resistance.

In applying Cu interconnect technology to flash memory devices, additional problems occur, particularly as dimensions shrink into the deep sub-micron regime. It was found that conventionally deposited PECVD silicon nitride capping layers contained hydrogen manifested by a high degree of Si—H bonding, thereby creating charge loss issues for miniaturized flash technology. It was also found that as dimensions continued to plunge, the adhesion of silicon nitride layers during chemical mechanical polishing (CMP) becomes problematic even with ammonia plasma treatments of the inlaid Cu prior to deposition of the capping layer. Such poor adhesion leads to poor electromigration performance.

Accordingly, there exists a need for semiconductor memory devices with improved reliability, increased operating speed and reduced device leakage. There exists a particular need for methodology enabling the fabrication of flash memory devices with improved data retention and improved reliability, and for flash memory devices with Cu interconnects exhibiting reduced electromigration and improved capping layer adhesion.

DISCLOSURE OF THE INVENTION

An advantage of the present invention is a method of manufacturing semiconductor memory devices with improved data retention, and comprising reliably capped Cu or Cu alloy interconnects with reduced interconnect capacitance, improved electromigration and improved capping layer adhesion.

Another advantage of the present invention is a semiconductor memory device exhibiting improved data retention and comprising reliably capped Cu or Cu alloy interconnects exhibiting reduced electromigration and improved capping layer adhesion.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device comprising: a layer of copper (Cu); a first silicon nitride layer, having a first silicon-hydrogen bond (Si—H) concentration, on the layer of Cu; and a second silicon nitride layer, having a second Si—H concentration less than the first Si—H concentration, on a first-silicon nitride layer.

Another advantage of the present invention is a method of fabricating a semiconductor device, the method comprising: depositing a layer of copper (Cu); depositing a first silicon nitride layer, having a first silicon-hydrogen bond (Si—H) concentration, on the layer of Cu; and depositing a second silicon nitride layer, having a second Si—H concentration less than first Si—H concentration, on the first silicon nitride layer.

Embodiments include depositing the first silicon nitride layer having a Si—H concentration of about 0.30% to about 0.90%, e.g., about 0.60%, at a thickness of about 50 Å to about 150 Å, e.g., about 100 Å, and depositing a second silicon nitride layer, having a Si—H concentration of about 0.02% to about 0.06%, e.g., about 0.04%, at a thickness of about 200 Å to about 600 Å, e.g., about 400 Å, on the first silicon nitride layer. Embodiments include depositing the first and second silicon nitride layers by PECVD. Typically, the second silicon nitride layer is deposited using a silane ($SiH_4$) flow rate less than that employed during deposition of the first silicon nitride layer but at a greater total RF power than employed during deposition of the first silicon nitride layer. In accordance with embodiments of the present invention, the first silicon nitride layer is deposited at a relatively high Si—H concentration for reduced electromigration and approved adhesion, while the second silicon nitride layer is deposited at a reduced Si—H concentration, thereby improving charge loss characteristics of the associated memory devices. The Si—H concentration expressed herein is based upon the fraction of Si—H bonds relative to the total Si and N bonds in the film.

Additional advantages of the present invention will become readily apparent to those skilled in this art from the following detailed description wherein embodiments of the present invention are described simply by way of illustration of the best mode contemplated to carry out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 and 2, similar reference characters denote similar features.

DESCRIPTION OF THE INVENTION

Figure 1:
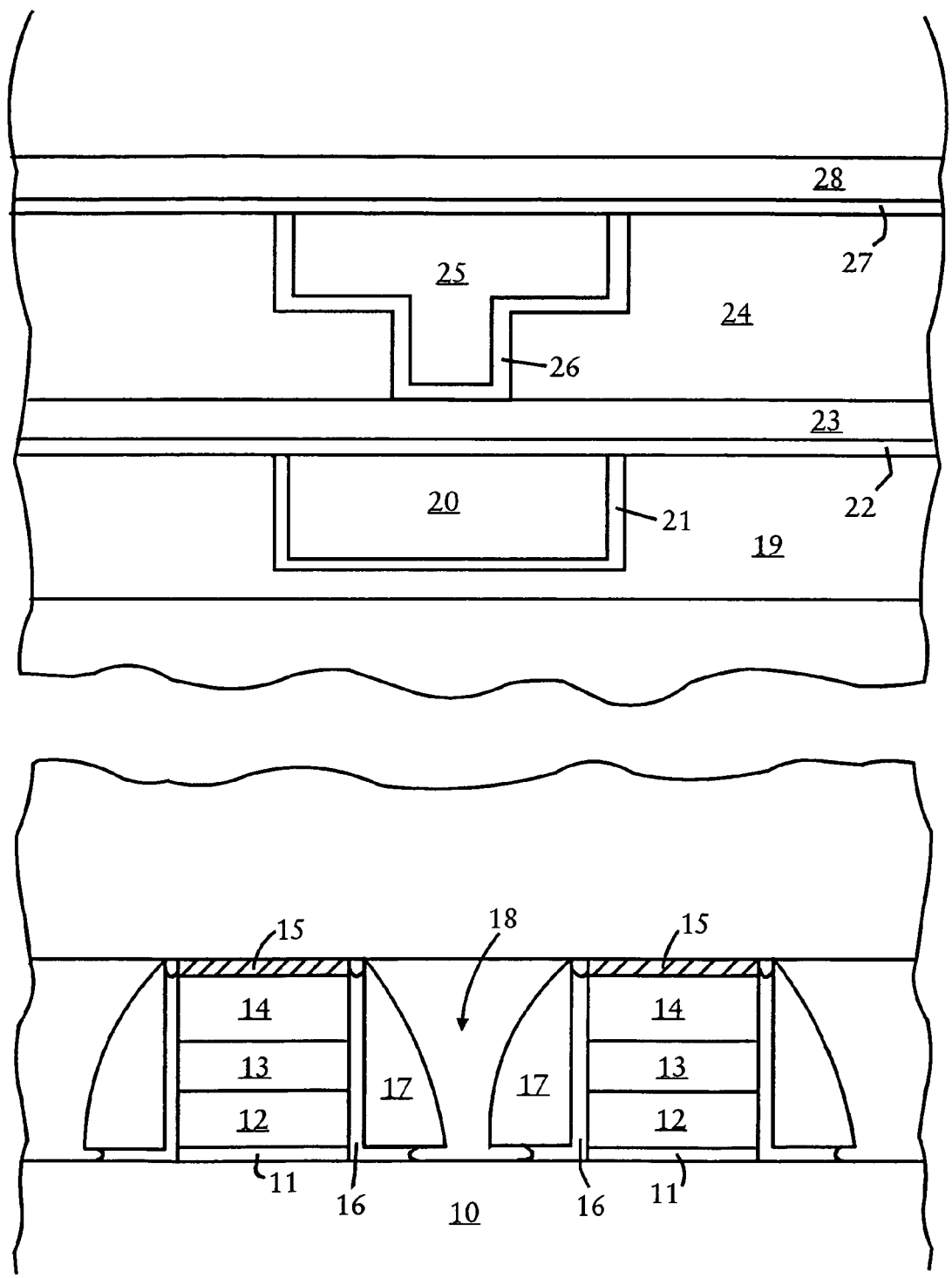
FIG. 1 schematically illustrates an embodiment of the present invention.

The present invention addresses and solves various reliability problems attendant upon conventional semiconductor fabrication techniques. These problems arise as semiconductor memory device dimensions continue to shrink, making it increasingly more difficult to effectively getter mobile ion contaminants, such as hydrogen. The hydrogen contamination problem becomes exacerbated when integrating copper interconnect technology with flash memory devices. It was found that conventionally deposited silicon nitride capping layers exhibit a relatively high degree of Si—H bonding, such as about 0.3% to about 0.9%, thereby generating charge loss problems for miniaturized flash technology. It was also found that the conventionally deposited silicon nitride layers do not adequately adhere to inlaid copper subsequent to implementing Cu CMP processing, even when the Cu surface is treated with an ammonia plasma. Such poor adhesion exacerbates electromigration issues.

The present invention addresses and solves such problems attendant upon conventional Cu interconnect technology by depositing a composite silicon nitride capping layer to effectively encapsulate inlaid copper, thereby presenting a diffusion barrier that adequately adheres to the inlaid copper, reduces electromigration issues and at the same time reduces charge loss in associated flash memory devices.

In accordance with embodiments of the present invention, the upper surface of the inlaid Cu may be treated initially with an ammonia plasma in a conventional manner. Subsequently, a first silicon nitride capping layer is deposited having a relatively high Si—H concentration, thereby providing additional silicon at the copper-silicon interface to improve adhesion thereby resulting in better electromigration performance. A second silicon nitride layer is then deposited on the first silicon nitride layer. The second silicon nitride layer has a very low concentration of Si—H bonds for reduced charge loss. The second silicon nitride layer is typically deposited without the use of ammonia, at a reduced $SiH_4$ flow rate and an increased total RF power. The silicon nitride layers can be deposited in situ, as by depositing the first silicon nitride layer and adjusting deposition conditions to deposit the second silicon nitride layer. Alternatively, the silicon nitride layers can be deposited sequentially.

In accordance with the embodiments of the present invention, the Si—H content of the second silicon nitride layer is significantly reduced as low as possible, such as to about 0.02% to about 0.06%, e.g., about 0.04% as assayed with a grazing incident Fourier transform (GI-FTIR).

As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, scandium, platinum, magnesium aluminum or zirconium.

In accordance with embodiments of the present invention, Cu may be inlaid in a wide variety of dielectric materials employed as interlayer dielectrics. Advantageously, dielectric materials for use as interlayer dielectrics in accordance with embodiments of the present invention can comprise dielectric materials with lower values of permittivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyamides and BCB. Other suitable low-k dielectrics include poly(arylene)ethers, poly(arylene)ether azoles, arylene-N, polyamides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid siloxane-organic polymer, and Nanoglass™, a nanoporous silica (each available from Honeywell Electronic Materials) and Halogen-doped (e.g., fluorine-doped) silicon dioxide derived from tetraethyl orthosilicate (TEOS) and fluorine-doped silicate glass (FSG).

An embodiment of the present invention is schematically illustrated in FIG. 1, wherein closely spaced apart gate electrode stacks of non-volatile transistors are formed on substrate 10. For illustrative convenience, the associated source/drain regions and local interconnects are not depicted. Each gate electrode stack comprises a tunnel oxide 11, a floating gate electrode 12, an interpoly dielectric layer 13, such as a silicon oxide/silicon nitride/silicon oxide (ONO) stack, and a control gate electrode 14 formed thereon. Typically, sidewall spacers are formed on side surfaces of the gate electrode stacks. Such sidewall spacers can include a silicon oxide liner 16 and silicon nitride spacers 17. A metal silicide layer 15, such as cobalt silicide or nickel silicide, can be formed on the control gate electrode 14. Reference character 18 denotes the first interlayer dielectric (ILDo), typically a layer of silicon oxide doped with boron and phosphorous, such as boron, phosphorous doped silicon oxide derived from tetraethyl orthosilicate (BP-TEOS).

There is also schematically illustrated in FIG. 1 an upper portion of an interconnect structure which comprises an interlayer dielectric (ILD) 19, such as a low-k interlayer dielectric, having inlaid Cu 20 therein. Reference character 21 denotes a diffusion barrier material, such as tantalum, tantalum nitride, tungsten or tungsten nitride. In accordance with embodiments of the present invention, the upper surface of inlaid Cu 20 can be exposed to an ammonia plasma, typically for about 30 seconds to about 60 seconds, to remove copper oxide which would otherwise adversely impact adhesion. Subsequently, a first silicon nitride layer 22 is deposited on the upper surface of the inlaid Cu encapsulating the inlaid Cu in the opening in ILD 19. The first silicon nitride layer is typically deposited at a thickness of 50 Å to about 150 Å, e.g., about 100 Å, by PECVD. For example, of the first silicon nitride layer 22, can be deposited at a $SiH_4$ rate of about 120 sccm to about 180 sccm, an ammonia ($NH_3$) flow rate of about 600 to about 900 sccm, a nitrogen ($N_2$) flow rate of about 8,000 to about 17,000 sccm, a pressure of about 1.2 Torr to about 6.0 Torr, a temperature of about 300° C. to about 420° C., and a total RF power of about 640 watts to about 960 watts, for a suitable period of time, e.g., about 0.5 seconds to about 3 seconds.

With in situ deposition, the $NH_3$ flow rate is discontinued and the second silicon nitride layer is deposited at a thickness of about 200 Å to about 600 Å, e.g., about 400 Å, using a reduced $SiH_4$ flow rate of about 16 sccm to about 24 sccm, e.g., about 20 sccm, a $N_2$ flow rate of about 18,000 to about 28,000 sccm, a pressure of about 1.2 Torr to about 6.0 Torr, a temperature of about 300° C. to about 420° C., and an increased total RF power of about 1,280 watts to about 1,920 watts, e.g., abut 1,600 watts, typically for about 8 seconds to about 27 seconds. It was determined by GI-FTIR that the first silicon nitride layer typically has a Si—H concentration of about 0.30 to about 0.90%, e.g., about 0.60%, and the second silicon nitride layer typically has a Si—H concentration of about 0.02% to about 0.06%, e.g., about 0.1%. In accordance with embodiments of the present invention, the Si—H concentration of the first silicon nitride layer is optimized for improved adhesion at the Cu interface thereby resulting in superior electromigration performance, while the Si—H concentration of the second silicon nitride layer is optimized for improved charge loss characteristics.

Adverting to FIG. 1, a subsequent ILD 24, such as another low-k dielectric layer, is deposited at an upper interconnect level, a dual damascene opening is formed therein, and a diffusion barrier 26, such as tantalum or tantalum nitride, titanium or titanium nitride, deposited to line the opening. A layer of Cu is then deposited followed by CMP resulting in inlaid Cu 25. In accordance with further embodiments of the present invention, a first silicon nitride layer 27 is deposited under conditions similar to those employed for depositing silicon nitride layer 22, and a second silicon nitride layer 28 is then deposited on silicon nitride layer 27 under conditions similar to those employed for depositing silicon nitride layer 23.

Mirrorbit technology is fundamentally different and more advanced than conventional floating gate technology, thereby enabling innovative and cost-effective advancements. A mirrorbit cell doubles the intrinsic density of a flash memory array by storing two physically distinct bits on opposite sides of a memory cell, typically within the nitride layer of the ONO stack of the gate dielectric layer separating the gate from the substrate. Each bit within a cell serves as a binary unit of data, e.g., either 1 or 0, mapped directly to the memory array. Reading or programming one side of a memory cell occurs independently of whatever data is stored on the opposite side of the cell. Consequently, mirrorbit technology delivers exceptional read and write performance for wireless and embedded markets.

Figure 2:
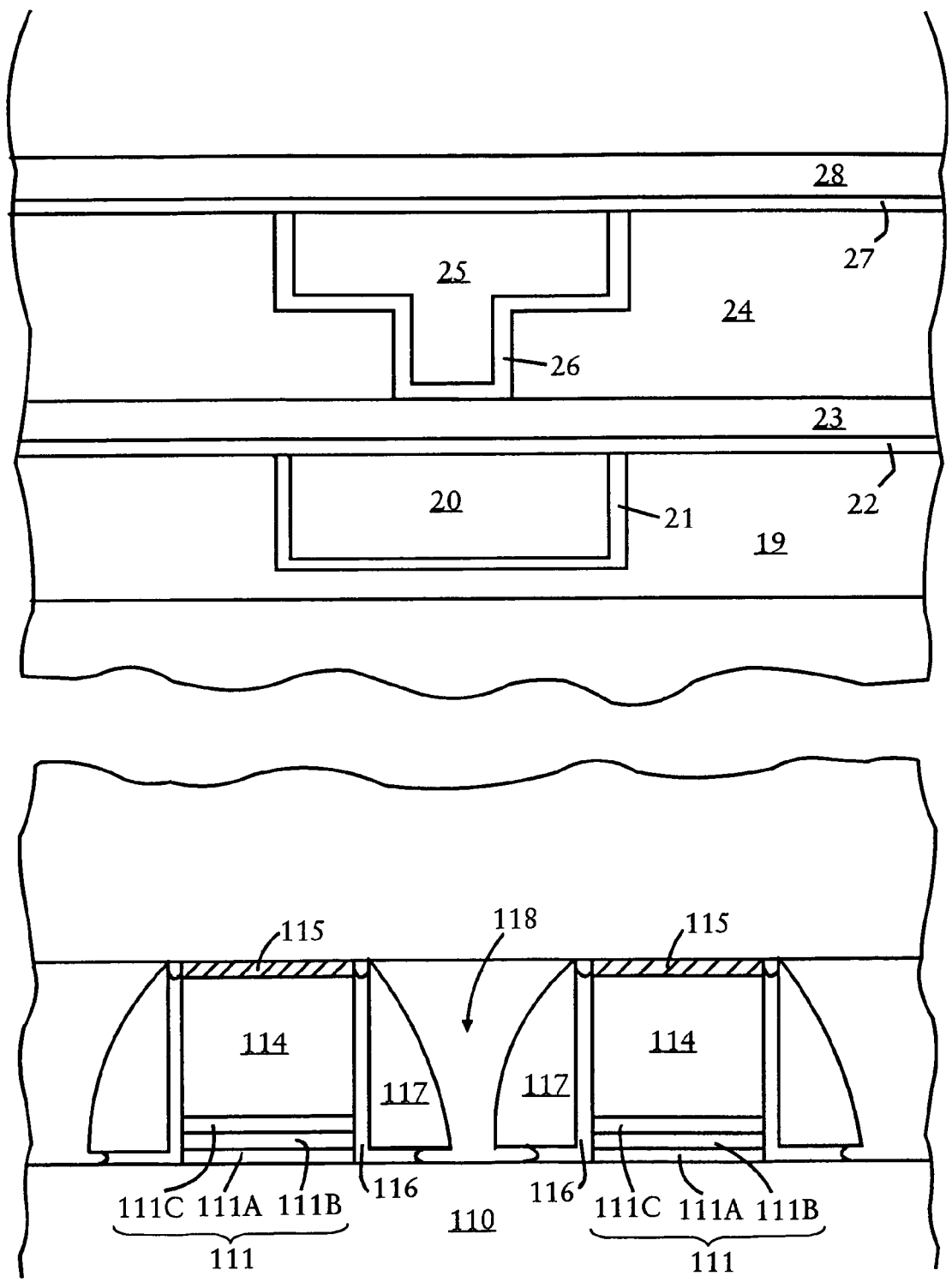
FIG. 2 schematically illustrates an embodiment of the present invention involving a mirrorbit device.

FIG. 2 illustrates another embodiment of the present invention that is similar to that illustrated in FIG. 1, except that the Cu interconnect structure is provided in a mirrorbit device rather than a non-volatile device. Adverting to FIG. 2, spaced apart gate electrode stacks of a mirrorbit device are formed on substrate 110. For illustrative convenience, the associated source/drain regions are not illustrated. Each gate electrode stack comprises a gate dielectric layer 111 formed of a composite ONO stack comprising silicon oxide layer 111A, silicon nitride layer 111B, and silicon oxide layer 111C, and a gate electrode 114 formed thereon. Typically, sidewall spacers are formed on side surfaces of the gate electrode stack, which sidewall spacers can include a silicon oxide liner 116 and silicon nitride spacers 117. A metal silicide layer 115, such as cobalt silicide or nickel silicide, can be formed on the gate electrode 114. Reference character 118 denotes the first interlayer dielectric (ILDo), such as a layer of silicon oxide doped with boron and phosphorus, such as boron, phosphorus doped silicon oxide derived from tetraethyl or thosilicate (BP-TEOS).

There is also schematically illustrated in FIG. 2 an upper portion of an interconnect structure which comprises an interlayer dielectric (ILD) 19, such as a low-k interlayer dielectric, having inlaid Cu 20 therein. Reference character 21 denotes a diffusion barrier material, such as tantalum, tantalum nitride, tungsten or tungsten nitride. In accordance with embodiments of the present invention, the upper surface of inlaid Cu 20 can be exposed to an ammonia plasma, typically for about 30 seconds to about 60 seconds, to remove copper oxide which would otherwise adversely impact adhesion. Subsequently, a first silicon nitride layer 22 is deposited on the upper surface of the inlaid Cu encapsulating the inlaid Cu in the opening in ILD 19. The first silicon nitride layer is typically deposited at a thickness of 50 Å to about 150 Å, e.g., about 100 Å, by PECVD, under conditions substantially similar to those employed to deposit silicon nitride layer 22, illustrated in FIG. 1.

With in situ deposition, the $NH_4$ flow rate is discontinued and the second silicon nitride layer 23 is deposited at a thickness of about 200 Å to about 600 Å, e.g., about 400 Å, under conditions similar to those employed to deposit second silicon nitride layer 23 in FIG. 1. It was determined by GI-FTIR that the first silicon nitride layer typically has a Si—H concentration of about 0.30 to about 0.90%, e.g., about 0.60%, and the second silicon nitride layer typically has a Si—H concentration of about 0.02% to about 0.06%, e.g., about 0.0%. In accordance with embodiments of the present invention, the Si—H concentration of the first silicon nitride layer is optimized for improved adhesion at the Cu interface thereby resulting in superior electromigration performance, while the Si—H concentration of the second silicon nitride layer is optimized for improved charge loss characteristics.

With continued reference to FIG. 2, a subsequent ILD 24, such as another low-k dielectric layer, is deposited at an upper interconnect level, a dual damascene opening is formed therein, and a diffusion barrier 26, such as tantalum or tantalum nitride, titanium or titanium nitride, deposited to line the opening. A layer of Cu is then deposited followed by CMP resulting in inlaid Cu 25. In accordance with further embodiments of the present invention, a first silicon nitride layer 27 is deposited under conditions similar to those employed for depositing silicon nitride layer 22, and a second silicon nitride layer 28 is then deposited on silicon nitride layer 27 under conditions similar to those employed for depositing silicon nitride layer 23.

The previously discussed embodiments are not exclusive. Alternate embodiments include depositing the silicon nitride capping layer as one graded film, wherein the SiH concentration decreases from the Cu layer across the thickness of the silicon nitride capping layer. Such embodiments can be implemented by gradually altering the SiH content to obtain a continuously graded film, or by changing the SiH concentration at various discreet points throughout deposition. In other embodiments of the present invention, the silicon nitride capping layer can comprise in excess of two layers, such as 3, 4, 5 or an even greater number of layers, wherein the SiH concentration increases from the upper surface of the Cu layer across the thickness of the silicon nitride capping layer, as described herein.

The present invention enables the fabrication of semiconductor memory device, particularly flash memory devices, exhibiting improved data retention, with associated Cu interconnects exhibiting improved electromigration performance due to improved capping layer adhesion to inlaid Cu. Semiconductor memory devices produced in accordance with the present invention enjoy industrial applicability in various commercial electronic devices, such as computers, mobile phones, cellular handsets, smartphones, set-top boxes, DVD players and records, gaming systems, and digital cameras.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of fabricating a semiconductor device, the method comprising:
   depositing a layer of copper (Cu);
   depositing a first silicon nitride layer having a first Si—H concentration, on the layer of Cu at a first $SiH_4$ flow rate of about 120 to about 180 sccm, and a first total RF power of about 640 watts to about 960 watts; and
   depositing the second silicon nitride layer having a second Si—H concentration at a second $SiH_4$ flow rate of about 14 to about 24 sccm and the second total RF power of about 1,280 watts to about 1,920 watts.

2. The method according to claim 1, comprising depositing the second silicon nitride layer at the second Si—H concentration of about 0.02% to about 0.06%.

3. The method according to claim 2, comprising depositing the first silicon nitride layer at the first Si—H concentration of about 0.30% to about 0.90%.

4. The method according to claim 3, comprising:
   depositing the first silicon nitride layer at a first thickness; and
   depositing the second silicon nitride layer at a second thickness greater than the first thickness.

5. The method according to claim 1, wherein the semiconductor device includes a mirrorbit device comprising an oxide/nitride/oxide (ONO) gate dielectric stack on a substrate and a gate electrode on the gate dielectric stack.

6. The method according to claim 1, comprising depositing the silicon nitride layer as one graded film by;
   modifying the Si—H concentration throughout deposition; or
   modifying the Si—H concentration at various discreet points during deposition.

7. The method according to claim 1, wherein
   said first silicon nitride layer is deposited by plasma enhanced chemical vapor deposition (PECVD) using ammonia and $SiH_4$; and
   said second silicon nitride layer is deposited by PECVD using nitrogen and $SiH_4$.

* * * * *